(12) United States Patent
Tan et al.

(10) Patent No.: US 7,643,805 B2
(45) Date of Patent: Jan. 5, 2010

(54) PEAK DETECTOR AND FIXED GAIN AMPLIFIER CIRCUIT FOR AUTOMATIC GAIN CONTROL AND VARIABLE GAIN AMPLIFIER CIRCUIT

(75) Inventors: Seeteck Tan, Singapore (SG); Xiaoyong Luo, Shanghai (CN)

(73) Assignee: O2Micro International Ltd., Georgetown (KY)

( * ) Notice: Subject to any disclaimer, the term of this patent is extended or adjusted under 35 U.S.C. 154(b) by 455 days.

(21) Appl. No.: 11/482,463

(22) Filed: Jul. 7, 2006

(65) Prior Publication Data
US 2008/0009255 A1 Jan. 10, 2008

(51) Int. Cl.
*H04B 1/04* (2006.01)
*H04B 1/06* (2006.01)
(52) U.S. Cl. .................. 455/127.2; 455/136; 455/232.1
(58) Field of Classification Search .............. 455/127.2, 455/136, 138, 232.1, 240.1, 245.1, 250.1, 455/251.1; 330/278, 254
See application file for complete search history.

(56) References Cited
U.S. PATENT DOCUMENTS
5,051,707 A * 9/1991 Fujita .......................... 330/279
5,168,148 A * 12/1992 Giebel .................... 235/462.26
5,838,194 A * 11/1998 Khoury ...................... 330/139
6,014,553 A * 1/2000 Kim ........................... 455/126
6,661,287 B2 * 12/2003 Lin et al. .................... 330/254
6,696,888 B2 * 2/2004 Gilbert ....................... 327/560
7,353,010 B1 * 4/2008 Zhang et al. .............. 455/234.1

* cited by examiner

*Primary Examiner*—Sonny Trinh
(74) *Attorney, Agent, or Firm*—Wang Law Firm, Inc.; Li K. Wang

(57) ABSTRACT

A variable gain amplifier (VGA) circuit and an automatic gain control (AGC) method thereof are disclosed. The VGA circuit includes an amplifier circuit and an AGC circuit. The amplifier circuit amplifies an input signal to an output signal according to a predetermined gain and the AGC circuit is connected to the amplifier circuit for regulating the predetermined gain. The AGC circuit further includes a peak detector detecting a peak of the output signal, a replica of the peak detector for detecting a peak of a reference signal, and a comparator for comparing the peak of the output signal with the peak of the reference signal to provide a control signal and then providing the control signal to the amplifier circuit to regulate the predetermined gain.

12 Claims, 13 Drawing Sheets

PEAK DETECTOR AND FIXED GAIN AMPLIFIER CIRCUIT FOR AUTOMATIC GAIN CONTROL AND VARIABLE GAIN AMPLIFIER CIRCUIT

FIELD OF THE INVENTION

The present invention relates to signal processing in communication systems, and more particularly to a signal amplifying circuit and gain control method in a radio frequency (RF) receiver.

BACKGROUND OF THE INVENTION

In communication technology, the communication data are conventionally modulated onto a signal and transmitted over a transmission channel. At a receiver end, the communication data are then recovered from the received signal. The amplitude of the received signal has an amplitude attenuation that is dependent on the length of the transmission path. Because the length of the transmission path, and thus the amplitude attenuation, are generally unknown, the amplitude of the received signal is consequently uncertain. In order to demodulate the communication data from the received signal, a variable gain amplifier (VGA) circuit is therefore included in the receiver to amplify the received signal. The VGA circuit conventionally operates in an automatic gain control (AGC) loop so as to generate a signal with a constant amplitude value independently of the received signal.

FIG. 1 shows a typical circuit diagram of a prior art receiver 100. The receiver 100 mainly includes an antenna 101, a low-noise amplifier (LNA) 103, a mixer 105, a local oscillator circuit (OSC) 107, a band pass filter (BPF) 108, a VGA circuit 109, an analog to digital converter (ADC) 111, and a demodulator 113. A high frequency signal that is modulated by the communication data is firstly received by the antenna 101, and then amplified by the LNA 103, mixed with a reference wave from the OSC 107 by a mixer 105, and filtered by the BPF 108. An intermediate frequency (IF) signal IF_IN is provided from the BPF 108 to the VGA circuit 109. The VGA circuit 109 further amplifies the IF signal IF and provides an amplified signal IF_OUT. Then, the ADC 111 converts the amplified signal IF_OUT from the VGA circuit 109 to a digital signal and the demodulator 113 demodulates the communication data from the digital signal.

FIG. 2 shows a circuit diagram of the VGA circuit 109 in FIG. 1. The VGA circuit 109 includes an amplifier unit 102 that consists of a variable gain amplifier 110 and a fixed gain amplifier 112, and an AGC loop 104 that consists of a peak detector 114, a comparator 116 and a loop filter 118. In the amplifier unit 102, the IF signal IF_IN from the BPF 108 firstly passes through the variable gain amplifier 110 and then through the fixed gain amplifier 112. Through the amplifier unit 102, the IF signal IF_IN is translated into the output signal IF_OUT with a predetermined gain. Furthermore, the level of the output signal IF_OUT is further stabilized by the AGC loop 104. Thus, the output signal IF_OUT obtains a constant and optimal voltage level that satisfies the dynamic range requirement of the ADC 111.

As shown in FIG. 2, one configuration of the AGC loop 104 is that the peak detector 114 receives the output signal IF_OUT from the output terminal of the fixed gain amplifier 112 and then provides a peak signal that indicates the peak of the output signal IF_OUT. The peak signal is then compared with a reference signal Vref by the comparator 116, which generates a control signal according to the comparison. After being filtered by the loop filter 118, the control signal is then used to regulate the gain of the variable gain amplifier 110. The AGC loop 104 will continue to regulate the gain until the peak signal is identical to the reference signal Vref. When the gain regulation completes, the output signal IF_OUT becomes constant.

Considering the input voltage range requirement of the peak detector 114, another configuration (not shown) of the AGC loop is conceived. In this configuration, the peak detector 114 is connected to the input terminal of the fixed gain amplifier 112. The remaining circuitry of the AGC circuit is the same as shown in FIG. 2.

However, performance of the peak detector 114 tends to change with process, voltage and temperature (PVT) variation. Thus, for both configurations of the AGC loop described above, the output signal IF_OUT cannot be accurately controlled. Furthermore, conventional fixed gain amplifier is also vulnerable to the PVT variation and therefore undermines the constancy of the output signal IF_OUT.

Therefore, it is desirable to have a circuit and method that does not suffer from the PVT variation and maintains the output signal constant and optimal. It is to such a circuit and method the present invention is primary directed.

SUMMARY OF THE INVENTION

In one embodiment, there is provided a variable gain amplifier circuit with automatic gain control. The variable gain amplifier circuit includes an amplifier unit and an automatic gain control loop. The amplifier unit has a predetermined gain and is capable of receiving an input signal and generates an output signal, the output signal having a first peak. The automatic gain control loop is connected to the amplifier unit and is capable of receiving the output signal and a reference signal with a second peak, detecting the first peak and the second peak, comparing the first peak with the second peak and generating a control signal, the control signal being used by the amplifier unit to regulate the predetermined gain.

In another embodiment, there is provided a method for amplifying an input signal to a constant output signal. The method includes the steps of receiving the input signal, generating an output signal with a predetermined gain, generating a first peak signal indicative of a peak of the output signal, generating a second peak signal indicative of a peak of a reference signal, generating a control signal according to comparison between the first peak signal and the second peak signal, and regulating the predetermined gain under control of the control signal to ensure the output signal being constant.

In yet another embodiment, there is provided a peak detector for detecting a peak of a signal. The peak detector includes a rectifier, a current mirror and a low pass filter. The rectifier is capable of receiving the signal and providing a current signal. The current mirror is coupled to the rectifier and is capable of mirroring the current signal and generating a mirrored current signal, the mirrored current signal having a DC level. The low pass filter is coupled to the current mirror and is capable of receiving the mirrored current signal and providing an output voltage signal, the low pass filter including a resistor coupled in parallel to a capacitor, and the output voltage signal indicating the peak of the signal.

In yet another embodiment, there is provided an amplifier circuit with a fixed gain. The amplifier circuit includes a trans-conductor circuit, a current mirror circuit, and a trans-impedance circuit. The trans-conductor circuit is capable of transforming a pair of differential input signals into a pair of current signals, includes a first resistor and has a first transconductance. The current mirror circuit is coupled to the trans-conductor circuit and is capable of mirroring the pair of current signals. The trans-impedance circuit is coupled to the current mirror circuit and is capable of transforming the pair of mirrored current signals into a pair of differential output signals, the trans-impedance circuit including a second resistor and having a second resistance.

In yet another embodiment, there is provided an amplifier circuit with a fixed gain. The amplifier circuit includes a trans-conductor circuit, a transconductance tuning circuit and a trans-impedance circuit. The trans-conductor circuit is capable of transforming a pair of differential input signals into a pair of current signals, the trans-conductor circuit having a first transconductance. The transconductance tuning circuit is coupled to the trans-conductor circuit and includes a transconductance tracking loop and a common mode feed back loop, the transconductance tracking loop being capable of providing a tune signal and the tune signal tuning the first transconductance, and a common mode feedback loop being capable of providing a feedback signal and the feedback signal ensuring the trans-conductor circuit in normal operation. The trans-impedance circuit is coupled to the trans-conductor circuit and is capable of transforming the pair of current signals into a pair of output signals, the trans-impedance circuit including a second resistor and having a second resistance.

In yet another embodiment, there is provided an amplifier with a programmable gain. The amplifier includes a fixed gain amplifier and a resistor network. the fixed gain amplifier further includes a trans-conductor circuit and a trans-impedance circuit, the trans-conductor circuit having a first transconducatance and the trans-impedance circuit having a second resistance. The resistor network is coupled to the trans-impedance circuit of the fixed gain amplifier and is capable of receiving digital signals and providing a predetermined load to the trans-impedance circuit under control of the received digital signals, the predetermined load determining the second resistance.

In yet another embodiment, there is provided a receiver for acquiring communication data that are coded in a radio frequency (RF) signal. The receiver includes an antenna for receiving the RF signal, a low noise amplifier for amplifying the received RF signal, a mixer for converting the amplified RF signal from the low noise amplifier into an intermediate frequency (IF) signal, a band pass filter (BPF) for filtering the IF signal, a variable gain amplifier (VGA) circuit with automatic gain control for amplifying the IF signal into a constant and optimal signal, an analog to digital converter for converting the constant and optimal signal into a digital signal, and a demodulator for demodulating the communication data from the digital signal. The VGA circuit includes an amplifier unit and an automatic gain control (AGC) loop. The amplifier unit is capable of amplifying the IF signal according to a predetermined gain, the AGC loop includes replica peak detectors that are capable of detecting a peak of the amplified IF signal and a peak of a reference signal, and a comparator capable of comparing the detected peak signals and providing a control signal to the amplifier unit, the control signal being used to regulate the predetermined gain.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION OF THE INVENTION

Figure 1:
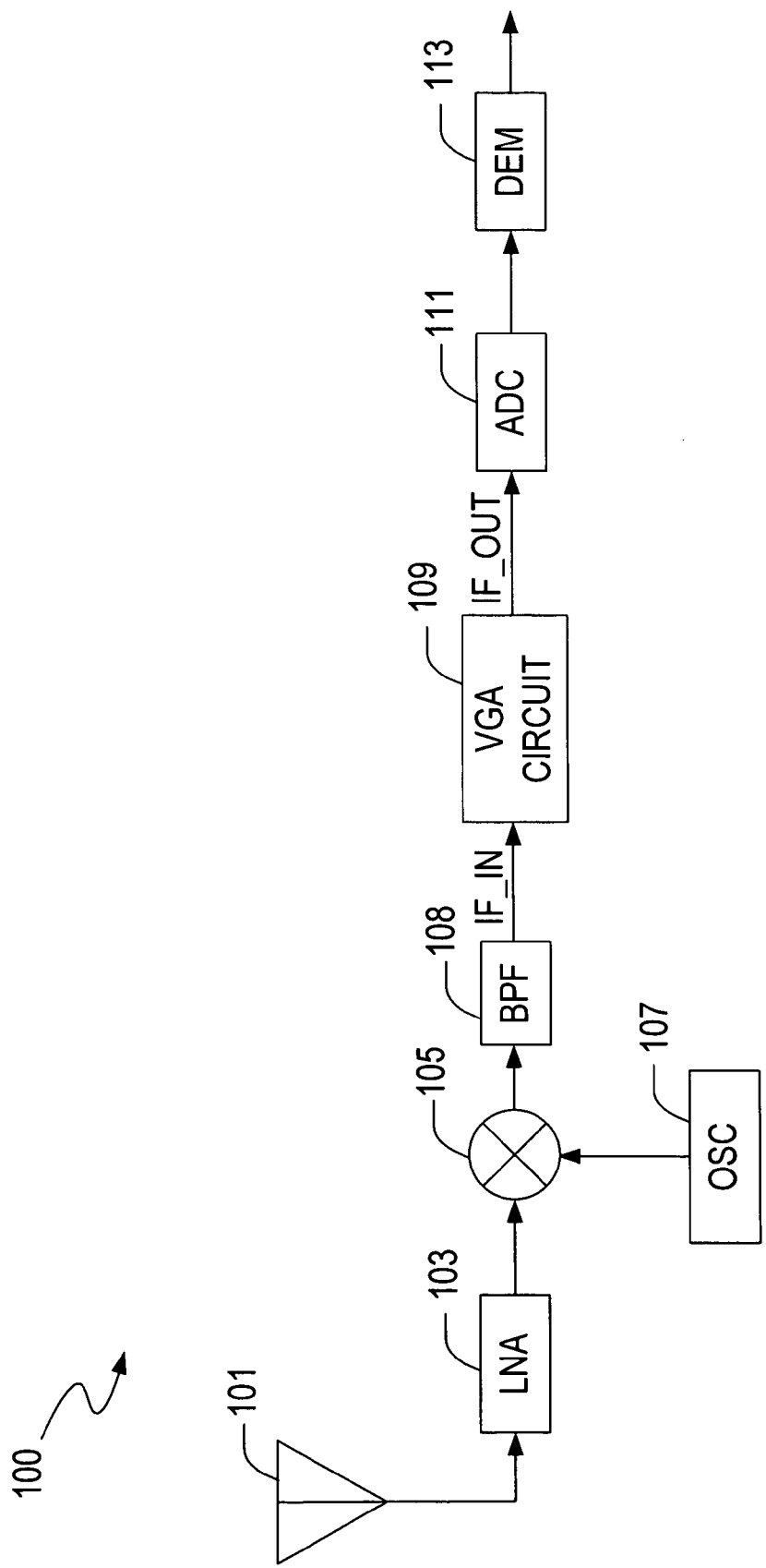
FIG. 1 is a typical circuit diagram of a prior art receiver.
Figure 2:
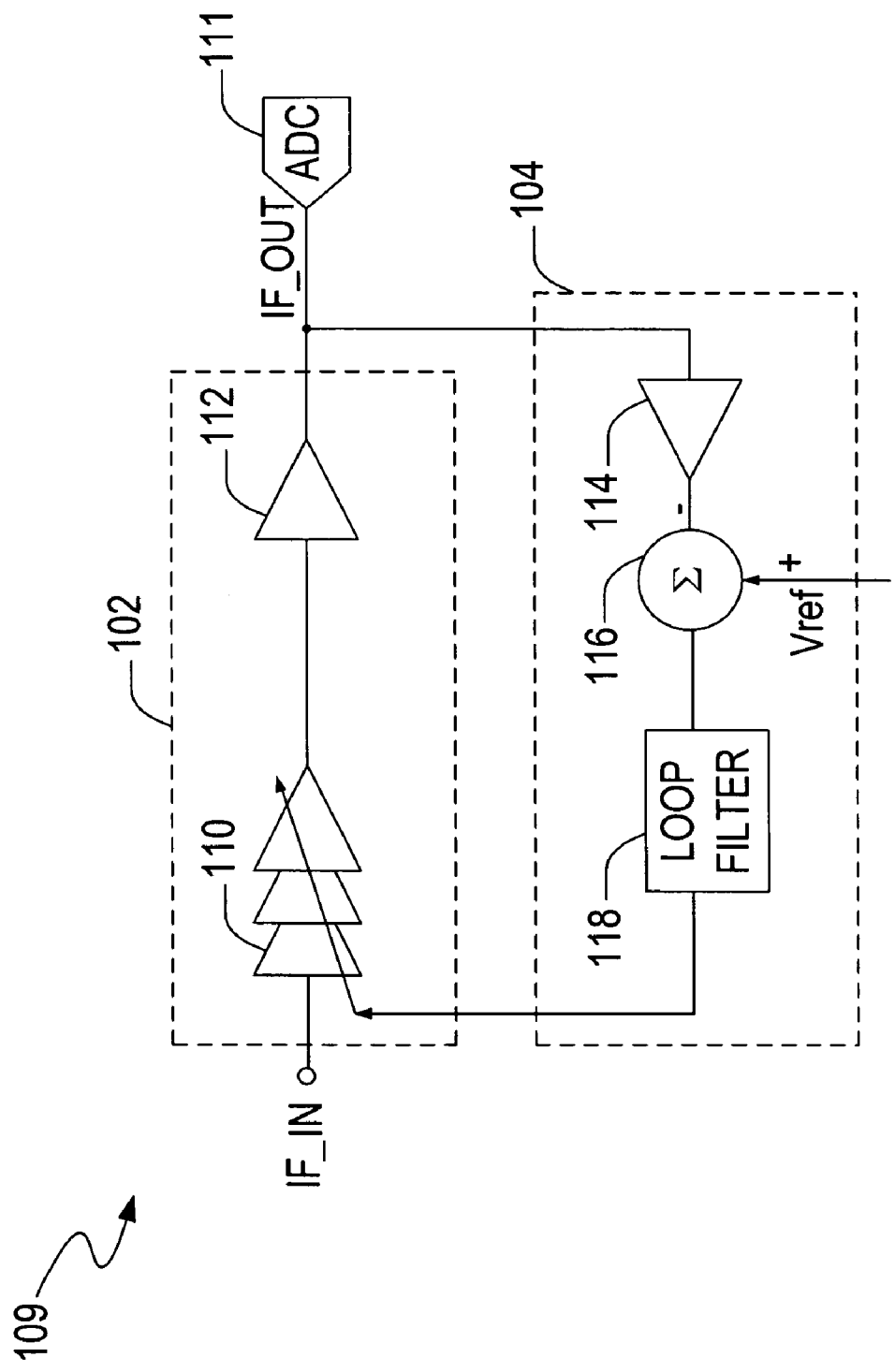
FIG. 2 is a prior art VGA circuit with automatic gain control.
Figure 3:
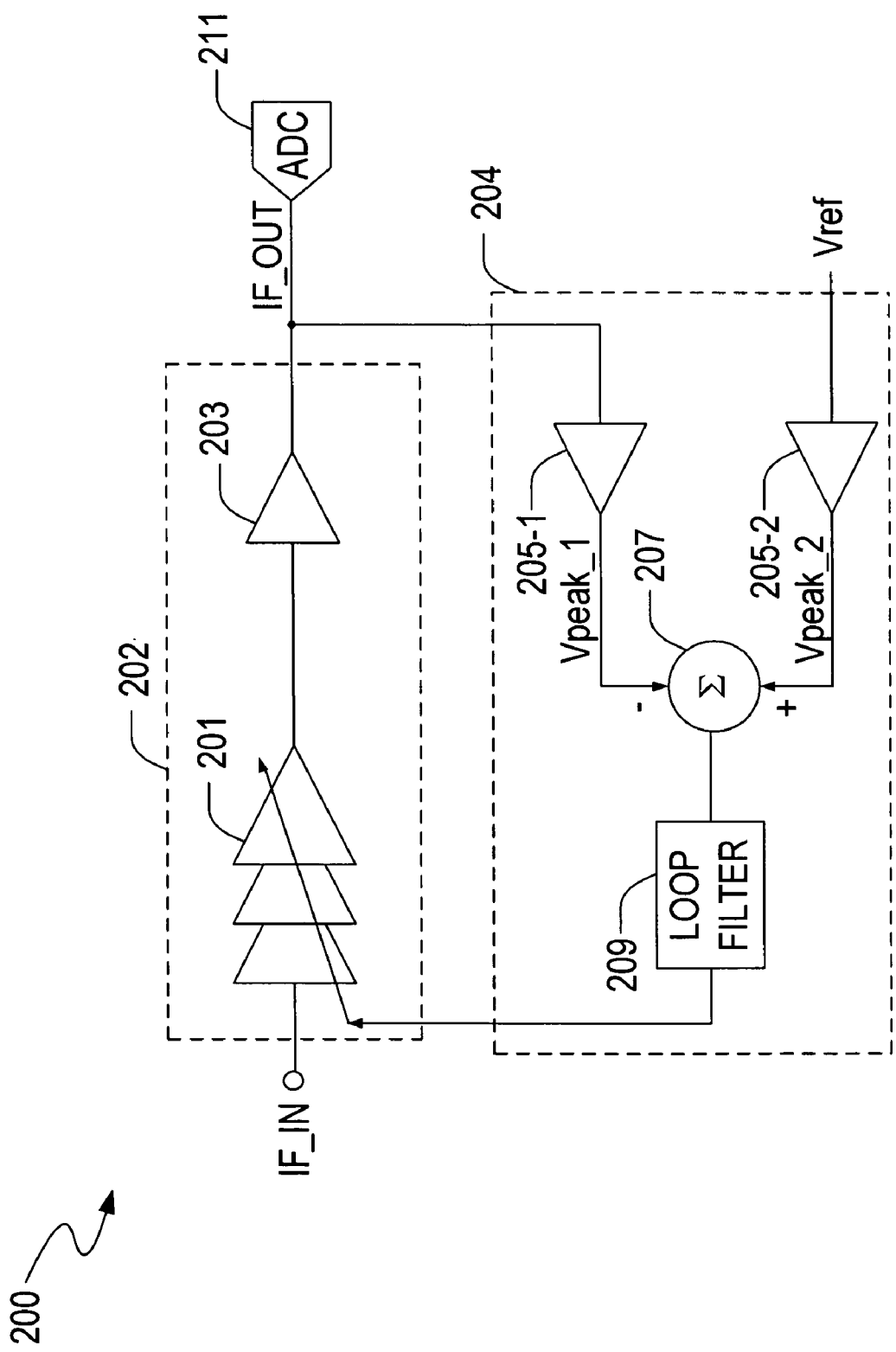
FIG. 3 is a block diagram of a VGA circuit with automatic gain control according to one embodiment of the present invention.

FIG. 3 illustrates a block diagram of a VGA circuit 200 according to one embodiment of the present invention. The VGA circuit 200 includes an amplifier unit 202 that consists of a variable gain amplifier 201 and a fixed gain amplifier 203, and an AGC loop 204 that consists of a first peak detector 205-1, a second peak detector 205-2, a comparator 207 and a loop filter 209. In the amplifier unit 202, after the IF signal IF_IN passes through the variable gain amplifier 201 and the fixed gain amplifier 203, the output signal IF_OUT with a predetermined gain is obtained. Then the first peak detector 205-1 detects the output signal IF_OUT and generates a first peak signal Vpeak_1 that indicates the peak of the output signal IF_OUT. Meanwhile, the second peak detector 205-2, which is a replica of the first peak detector 205-1, detects a reference signal Vref that is derived from a bandgap voltage reference circuit (not shown) and generates a second peak signal Vpeak_2 that indicates the peak of the reference signal Vref. The first and second peak signals are compared by the comparator 207, which generates a control signal according to the comparison. After being filtered by the loop filter 209, the control signal is provided to the variable gain amplifier 201 for regulating the predetermined gain.

Since the first and second peak detectors 205-1 and 205-2 have the same response to the PVT variation, the output signal IF_OUT is always maintained constant although the PVT conditions vary. Furthermore, considering the input voltage range of the first and second peak detectors 205-1 and 205-2, the automatic gain control circuit can also be connected to the input terminal of the fixed gain amplifier 203.

Figure 4:
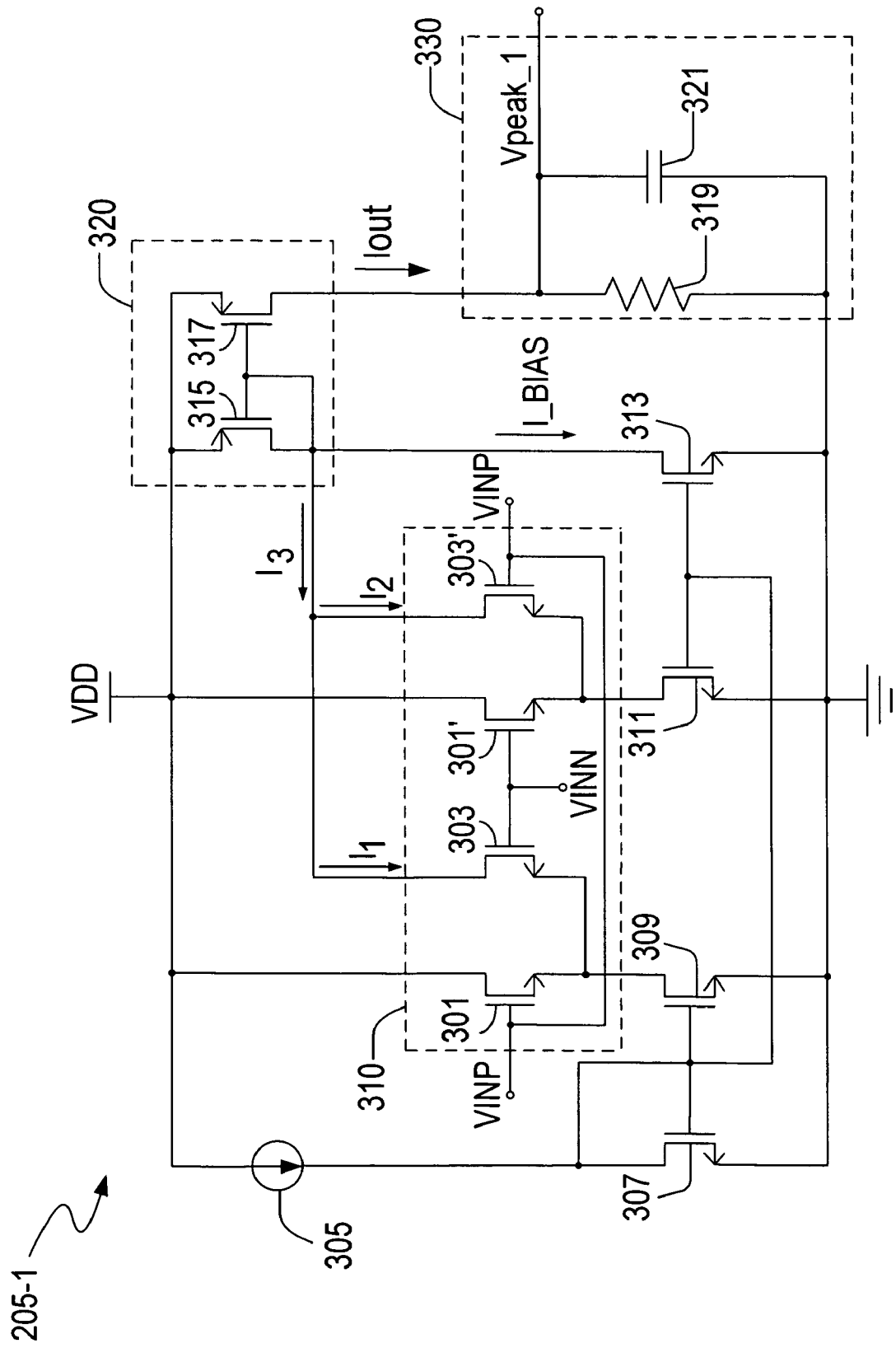
FIG. 4 is a schematic diagram of a peak detector according to one embodiment of the present invention.

FIG. 4 illustrates a schematic diagram of the peak detector 205-1 in FIG. 3 according to one embodiment of the present invention. The peak detector 205-1 includes a full-wave rectifier 310, a current mirror 320, and a low pass filter (LPF) 330.

The full-wave rectifier 310 is composed of transistors 301, 303, 301' and 303'. The transistors 301 and 303 form a first differential input pair and the transistors 301 and 303' form a second differential input pair. The two differential input pairs are interconnected with each other at terminals VINP and VINN. The full-wave rectifier 310 is adopted for its superior common-rejection capacity and noise-immunity. The static currents of the first and second differential input pairs are originated from a current source 305. The current from the current source 305 is mirrored to the transistor 301 of the first differential input pair via a current mirror formed by transistors 307 and 309, and mirrored to the transistor 301' of the second differential input pair via another current mirror formed by transistors 307 and 311. The output current I3 of the full-wave rectifier 310 is a sum of the output current I1 of the first differential pair and the output current I2 of the second differential pair.

The output current I3 is then mirrored to a transistor 317 via the current mirror 320 formed by transistors 315 and 317. In addition, a current I_BIAS provided by a transistor 313 is also mirrored to the transistor 317 to enhance the DC level of the current output from the current mirror 320. Finally, the current Iout flowing through the transistor 317 is a sum of I3 and I_BIAS. Similarly, the current I_BIAS is also obtained via the current source 305 and the current mirror formed by the transistors 307 and 313. The current Iout then flows through a resistor 319 coupled in series with the transistor 317 to provide the peak signal Vpeak_1, which represents the peak of the detected signal IF_OUT. Furthermore, a capacitor 321 is connected in parallel with the resistor 319 to form the LPF 330.

Without deviating from the spirit of the illustrated exemplary schematic diagram, the peak detector may be composed of other circuitries. For example, the static current of the differential input pairs can be provided by separate current sources instead of being originated from the current source 305. The current through the transistor 313 can also be provided by a separate current source. It should be understood that these modifications are within the scope of the claims.

Figure 5:
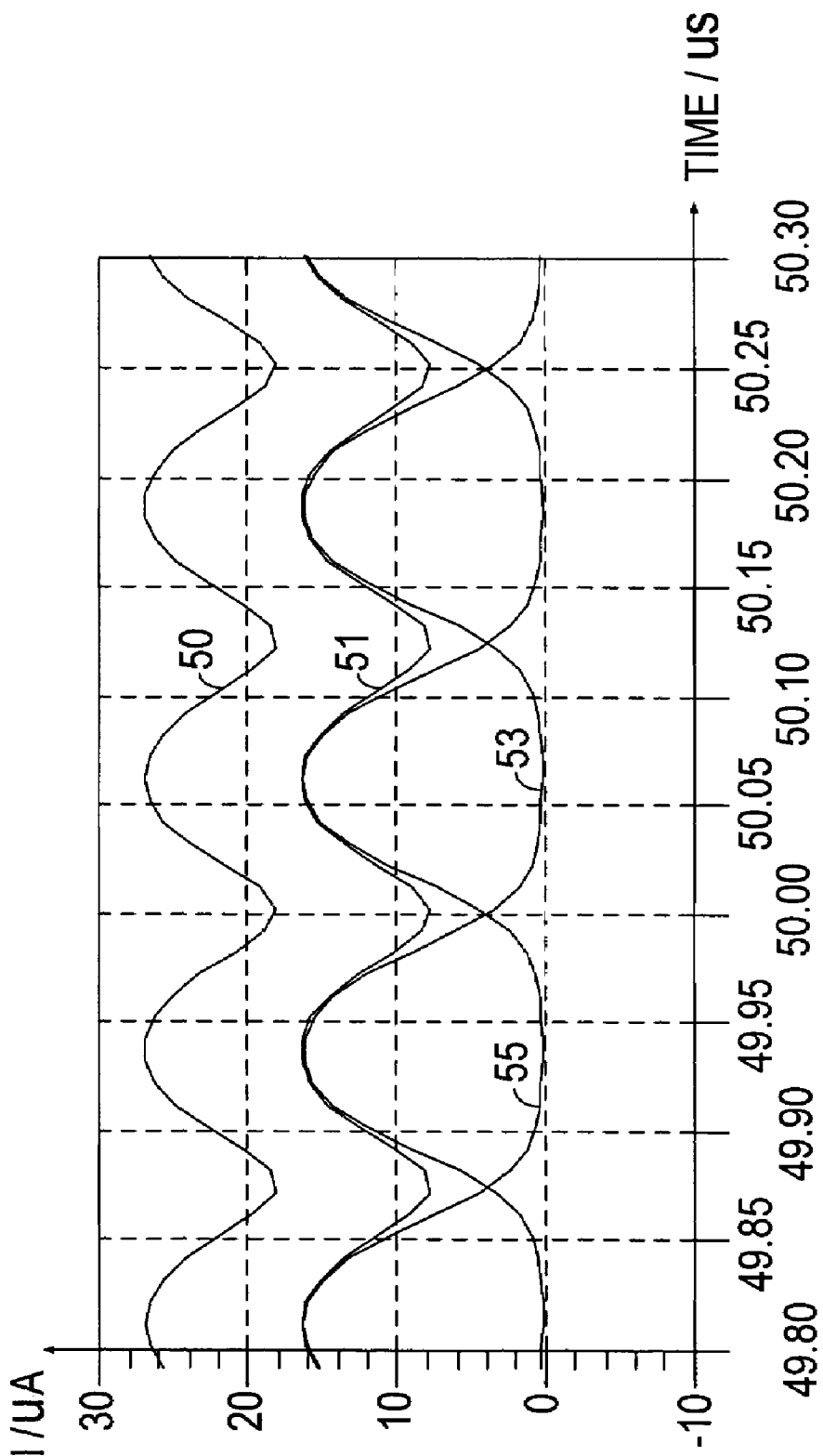
FIG. 5 is a waveform plot of the peak detector in FIG. 4.

FIG. 5 is a waveform plot of the exemplary peak detector 205-1. The waveforms 50, 51, 53, and 55 respectively indicate the current waveforms of the currents Iout, I3, I2 and I1 in function of time.

Figure 6:
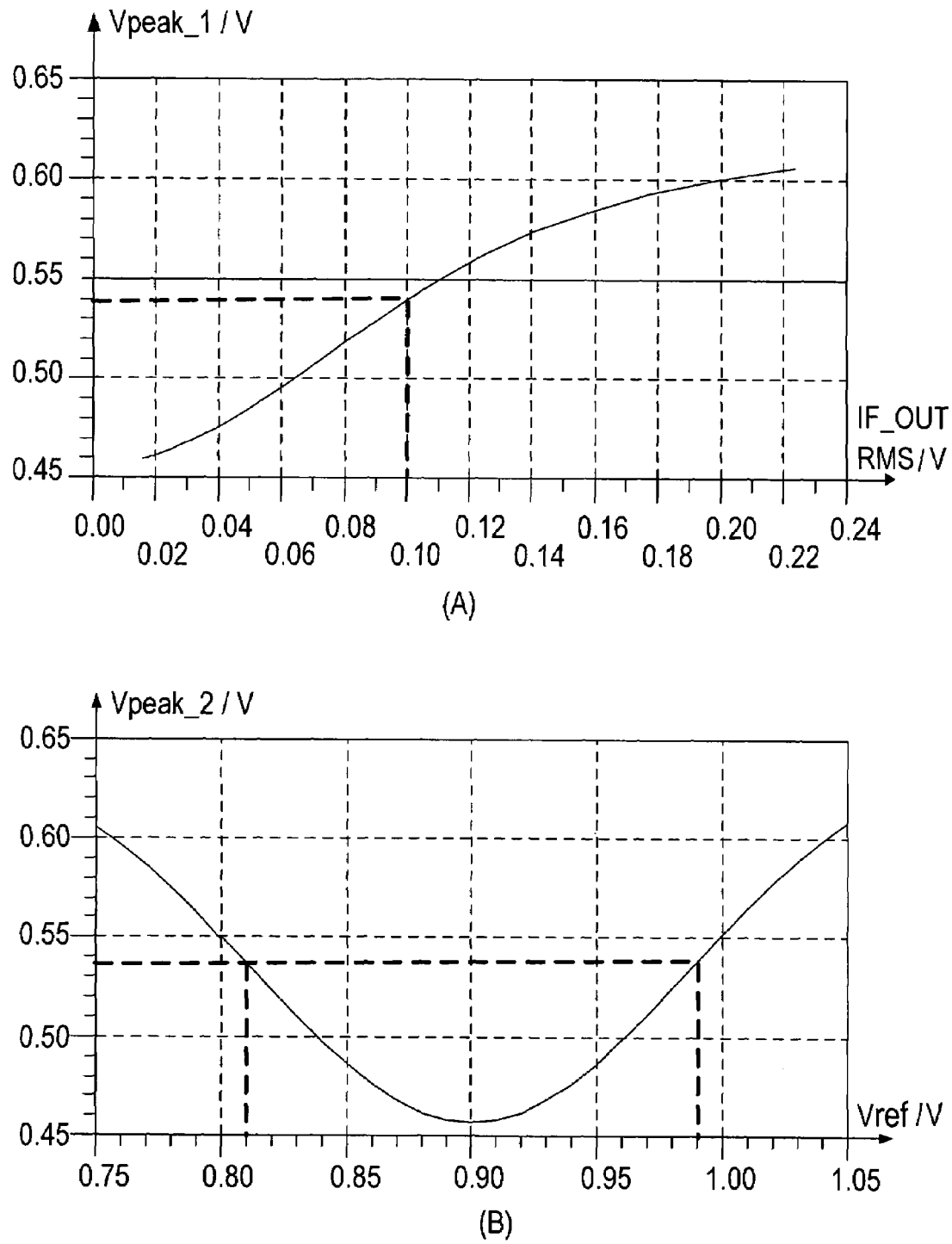
FIG. 6 is a plot indicating characteristics of the peak detectors in FIG. 3.

FIG. 6 shows plots (A) and (B) that respectively indicate characteristics of the first peak detector 205-1 and the second peak detector 205-2. In the plot (A), the first peak signal Vpeak_1 is plotted against an amplitude of the signal IF_OUT. The amplitude of the signal IF_OUT refers to the root mean square (RMS) voltage value. In the plot (B), the second peak signal Vpeak_2 is plotted against the voltage level of the reference signal Vref. From the plots (A) and (B), it can be determined that the voltage level of the reference signal Vref can be set to either 0.81V or 0.99V to maintain the amplitude of the signal IF_OUT at 0.1 Vrms. Thus, the peak of the signal IF_OUT and the peak of the reference signal Vref are both detected at 0.539V. Due to the excellent common-mode rejection characteristic of the exemplary peak detector, common voltage inputs of the first peak detector and the second peak detector need not be identical. Fox example, if the common voltage input of the second peak detector has a slight change from the exemplary 0.9V in FIG. 6, the amplitude of the signal IF_OUT can still be maintained at 0.1 Vrms as long as differential input of the second peak detector is maintained at 90 mv or −90 mv. Generally, difference of up to 0.2V between the common voltage inputs of the first and second peak detectors will not affect the accuracy of detecting the peak of the signal IF_OUT.

Figure 7:
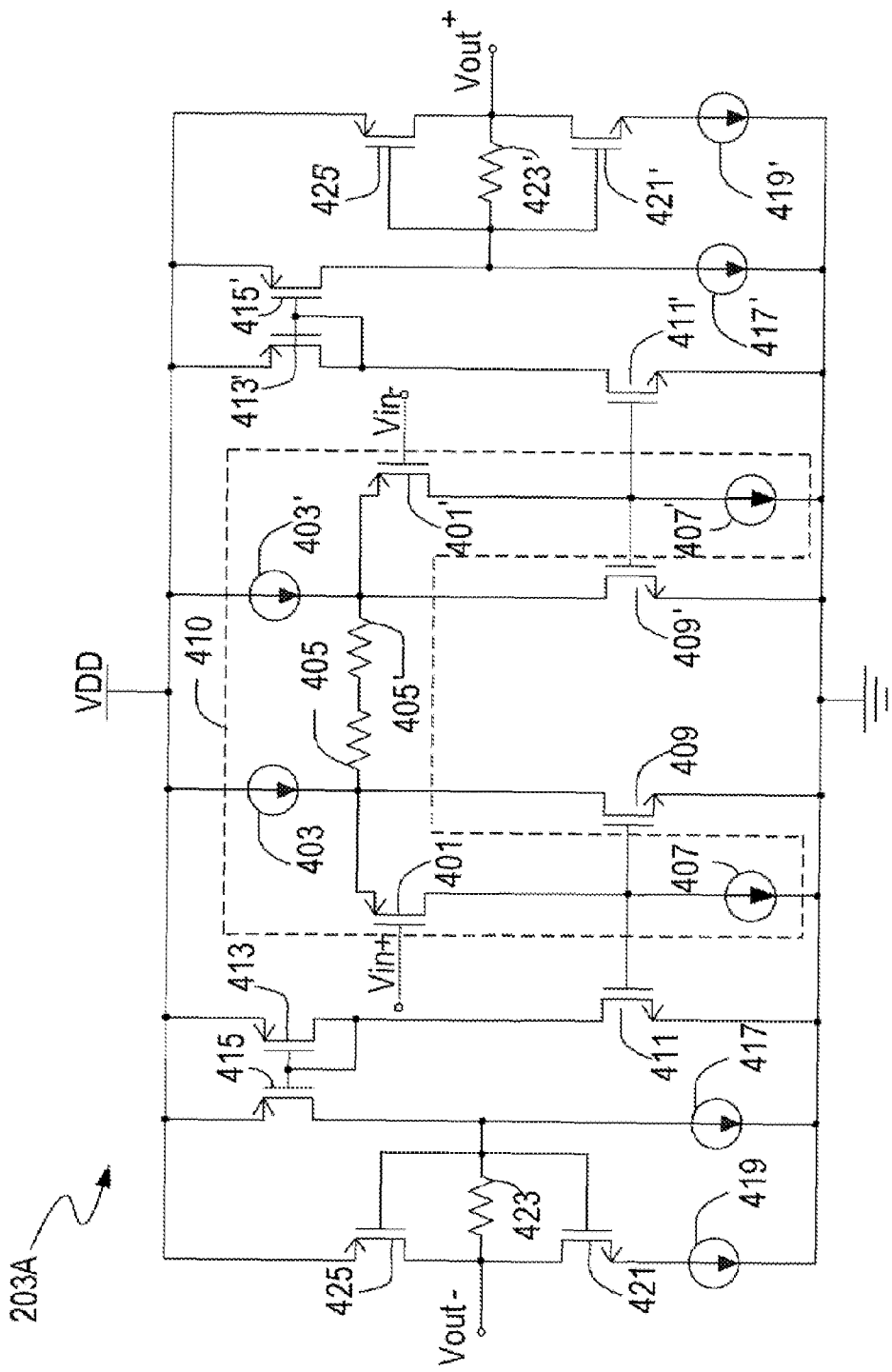
FIG. 7 is a schematic diagram of a fixed gain amplifier according to one embodiment of the present invention.

FIG. 7 illustrates an exemplary fixed gain amplifier 203A. The fixed gain amplifier 203A includes a trans-conductor circuit 410, a current mirror circuit composed of transistors 409, 409', 411, 411', 413, 413', 415 and 415' and current sources 417 and 417', and a trans-impedance circuit composed of transistors 421, 421', 425 and 425', resistor 423 and 423' and current sources 419 and 419'. The trans-conductor circuit 410 includes transistors 401 and 401', current sources 403 and 403', resistors 405 and 405', and current sources 407 and 407'. The gate terminals of the transistors 401 and 401' receives differential inputs Vin+ and Vin−. The drain terminals of the transistors 401 and 401' are connected to the ground respectively via the current sources 407 and 407'. The source terminals of the transistors 401 and 401' are connected to a power supply VDD respectively via the current sources 403 and 403'. Further, the source terminals of the transistors 401 and 401' are connected to each other through the resistors 405 and 405'.

The currents provided by the current sources 407 and 407' are forced to flow respectively through the transistors 401 and 401' and the gate-source voltages Vgs of the transistors 401 and 401' are kept constant. Thus the transistors 401 and 401' serve as voltage followers buffering the differential inputs Vin+ and Vin− across the resistors 405 and 405' to generate a small-signal current pair. The transconductance of the transconductor circuit 410 is equal to 1/R1, where R1 is defined as the resistance of the resistor 405 or 405'. The small-signal current pair then flow respectively through the transistors 409 and 409' and mirrored to the trans-impedance circuit by the current mirror circuit. One branch of the current mirror circuit that is formed by transistors 409, 411, 413 and 415 and the current source 417, mirrors the small-signal current from the transistors 409. The other branch of the current mirror circuit that is formed by transistors 409', 411', 413' and 415' and the current source 417', mirrors the small-signal current from the transistors 409'.

The mirrored current is finally received by the trans-impedance circuit. One branch of the trans-impedance circuit that is formed by the transistors 421 and 425, the resistor 423 and the current source 419, receives the current mirrored from the transistor 409. The other branch of the trans-impedance circuit that is formed by the transistors 421' and 425', the resistor 423' and the current source 419', receives the current mirrored from the transistor 409'. When the mirrored small-signal current pairs flow through the resistors 423 and 423', differential outputs Vout+ and Vout− are obtained. The resistance of the trans-impedance circuit is equal to Rf, where Rf is defined as the resistance of the resistor 423 or 423'. It can be concluded that the gain of the fixed gain amplifier 203A is calculated according to an equation 1) below.

$$A_G = Rf/R1 \quad \quad 1)$$

$A_G$ is defined as the gain of the fixed gain amplifier 203A. In the equation 1), it is assumed that no current amplification is conducted in the current mirror circuit. However, the current mirror circuit is capable of providing a mirror gain M to the fixed gain amplifier 203A by amplifying the small-signal current flowing through the transistors 409 and 409'. In the situation, the gain of the fixed gain amplifier 203A is calculated according to an equation 2) below.

$$A_G = M*Rf/R1 \quad \quad 2)$$

According to the equation 2), the gain $A_G$ is determined by the mirror gain M and the ratio of the two resistances Rf and R1. Therefore, if the resistors 423 and 405 belong to the same type and match with each other, the gain $A_G$ will be maintained constant regardless of the PVT variation.

Figure 8:
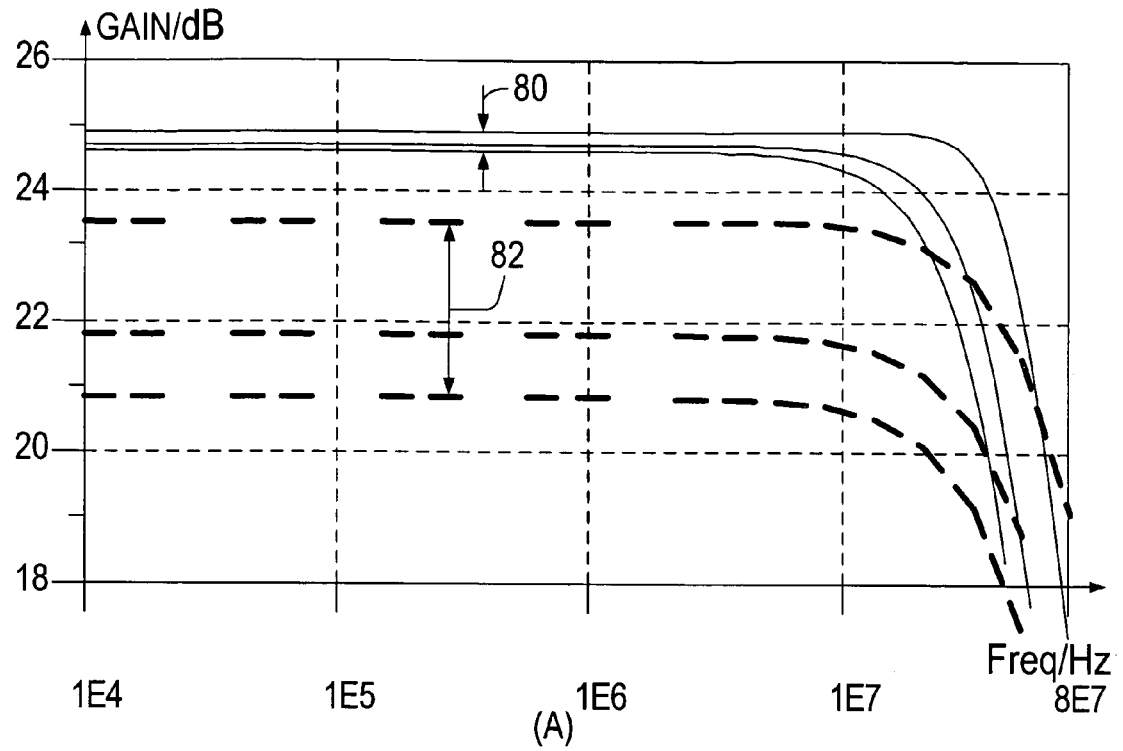
FIG. 8 is a Bode plot of the fixed gain amplifier in FIG. 7.
Figure 8:
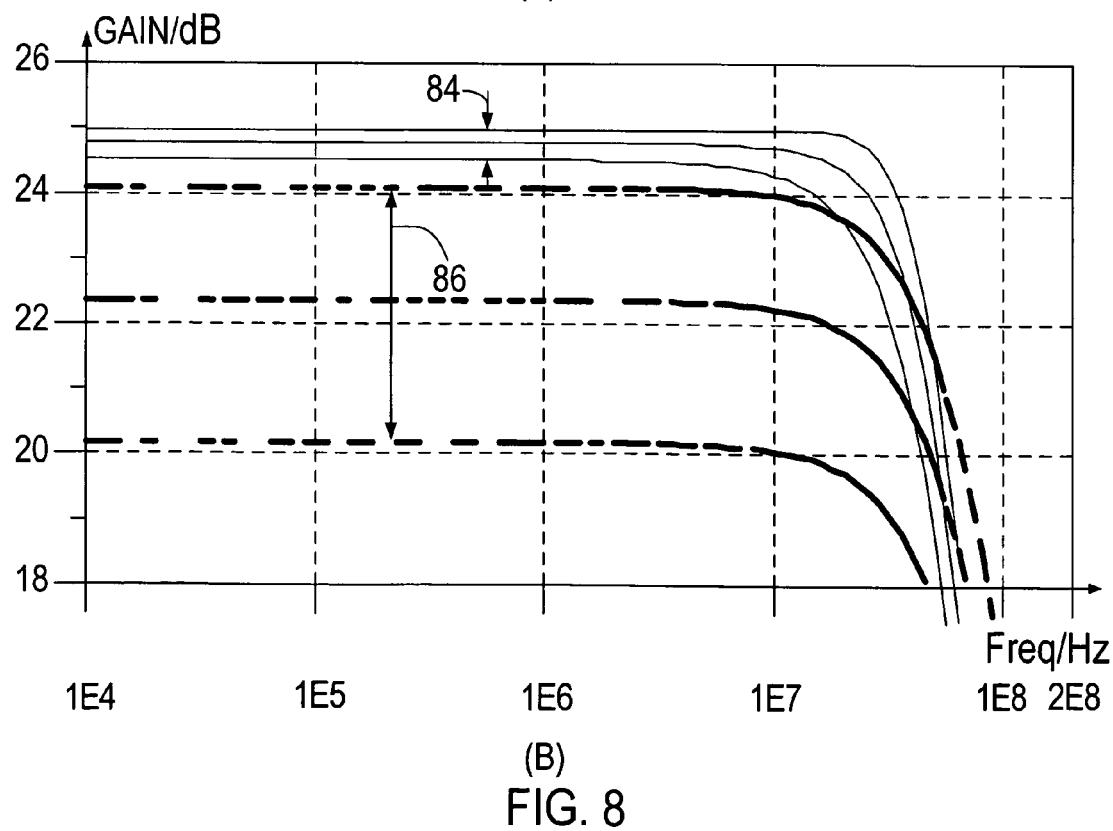

FIG. 8 is a Bode plot of the fixed gain amplifier 203A. The gain $A_G$ in dB is plotted against the frequency in Hz. When the temperature changes from −40° C. to 125° C., plot (A) indicates gain variation in response to the temperature variation, wherein the solid curves denote the Bode plot of the fixed gain amplifier 203A and the dashed curves denote the Bode plot of a conventional fixed gain amplifier. It can be observed that the gain of the fixed gain amplifier 203A has a variation 80, the gain of the conventional fixed gain amplifier has a variation 82, and the variation 80 is much less than the variation 82. When the process change incurs a ±20% resistance variation, plot (B) indications gain variation in response to the resistance variation. It can be observed that the gain of the fixed gain amplifier 203A has a variation 84, the gain of the conventional fixed gain amplifier has a variation 86, and the variation 84 is much less than the variation 86.

Figure 9:
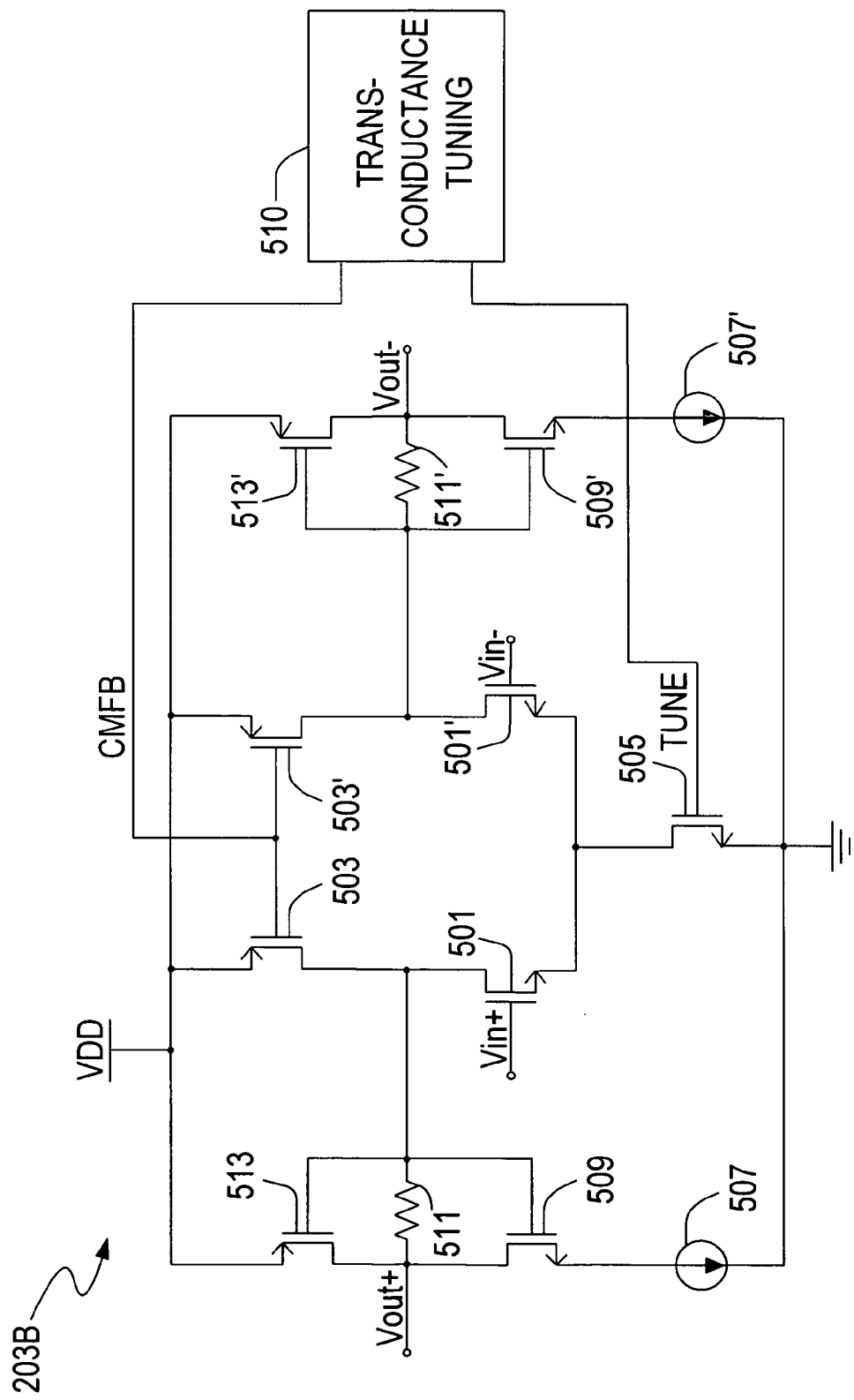
FIG. 9 is a schematic diagram of a fixed gain amplifier according to another embodiment of the present invention.

FIG. 9 illustrates another exemplary fixed gain amplifier 203B. The fixed gain amplifier 203B includes a trans-conductor circuit, a trans-impedance circuit and a transconductance tuning circuit 510.

The trans-conductor circuit includes transistors 501, 501', 503, 503' and 505. The gate terminals of the transistors 501 and 501' receive differential inputs Vin+ and Vin−. The drain terminals of the transistors 501 and 501' are connected to the power supply VDD respectively via the transistors 503 and 503'. The source terminals of the transistors 501 and 501' are connected together to the ground via the transistor 505. Furthermore, the gate terminals of the transistors 503 and 503' are connected together to receive a feedback signal CMFB from the transconductance tuning circuit 510. The gate terminal of the transistor 505 is controlled by a tune signal TUNE from the transconductance tuning circuit 510. The feedback signal CMFB ensures the trans-conductor circuit in normal operation and the tune signal TUNE determines a transconductance of the trans-conductor circuit. In normal operation, the trans-conductor circuit receives the differential inputs Vin+ and Vin−, and outputs a current pair at the drain terminals of the transistors 501 and 501'.

The trans-impedance circuit has two symmetrical branches. One branch is composed of transistors 509 and 513, a resistor 511 and a current source 507 for receiving one current of the current pair from the trans-conductor circuit. The other branch is composed of transistors 509' and 513', a resistor 511' and a current source 507' for receiving the other current of the current pair from the trans-conductor circuit. When the current pair respectively flow through the resistors 511 and 511', differential outputs Vout+ and Vout− are obtained. The resistance of the trans-impedance circuit is equal to Rf, where Rf is defined as the resistance of the resistor 511 or 511'. It can be concluded that the gain of the fixed gain amplifier 203B is calculated according to an equation 3) below.

$$A_G = G_M * Rf \qquad 3)$$

$G_M$ is defined as the transiconductance of the trans-conductor circuit and $A_G$ is defined as the gain of the fixed gain amplifier 203B.

Figure 10:
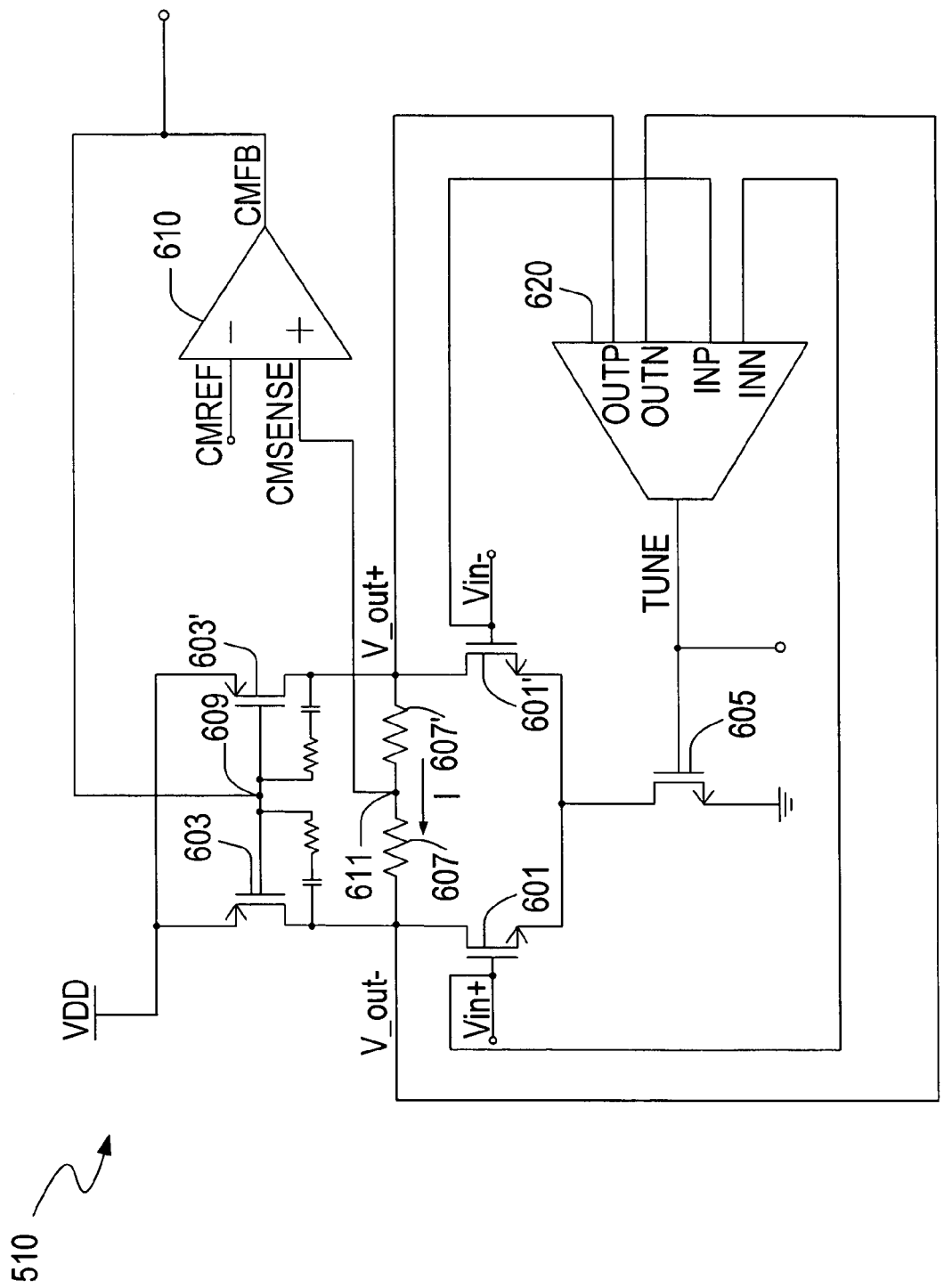
FIG. 10 is a schematic diagram of the transconductance tuning circuit in FIG. 9.

FIG. 10 is a schematic diagram of the transconductance tuning circuit 510 in FIG. 9. The transconductance tuning circuit 510 includes a common mode feedback loop, a transconductance tracking loop, and a replica circuit of the trans-conductor circuit in FIG. 9, which is composed of transistors 601, 601', 603, 603' and 605 herein. The drain terminals of the transistors 601 and 601' are further connected to each other via two identical resistors 607 and 607'. The common mode feedback loop can be composed of a folded cascade operational amplifier (OPA) 610 and connected between nodes 609 and 611. The inverting terminal of the folded cascade OPA 610 receives a reference signal CMREF and the non-inverting terminal of the folded cascade OPA 610 receives a sense signal CMSENSE from the node 611. Then, the folded cascade OPA 610 provides the feedback signal CMFB to the replica trans-conductor circuit for maintaining transistors 601, 601', 603 and 603' working in the saturation region.

The transconductance tracking loop is composed of a differential input amplifier 620 and connected between the gate and drain terminals of transistors 601 and 601'. The transconductance tracking loop provides the tune signal TUNE to maintain the voltage difference of the differential outputs V_out+ and V_out− at the drain terminals of the transistors 601 and 601' is equal to 2*Vin, wherein Vin is defined as the voltage difference of the differential inputs Vin+ and Vin− at the gate terminals of the transistors 601 and 601'. Therefore, it can be deduced that the transconductance of the replica trans-conductor circuit is equal to 1/R1, where R1 is defined as the resistance of the resistors 607 or 607'. Controlled by the same feedback signal and tune signal, the transconductance $G_M$ of the trans-conductor circuit in FIG. 9 is also equal to 1/R1. According to the equation 3), the gain of the fixed gain amplifier 203B can be rewritten as an equation 4) below.

$$A_G = Rf/R1 \qquad 4)$$

Figure 11:
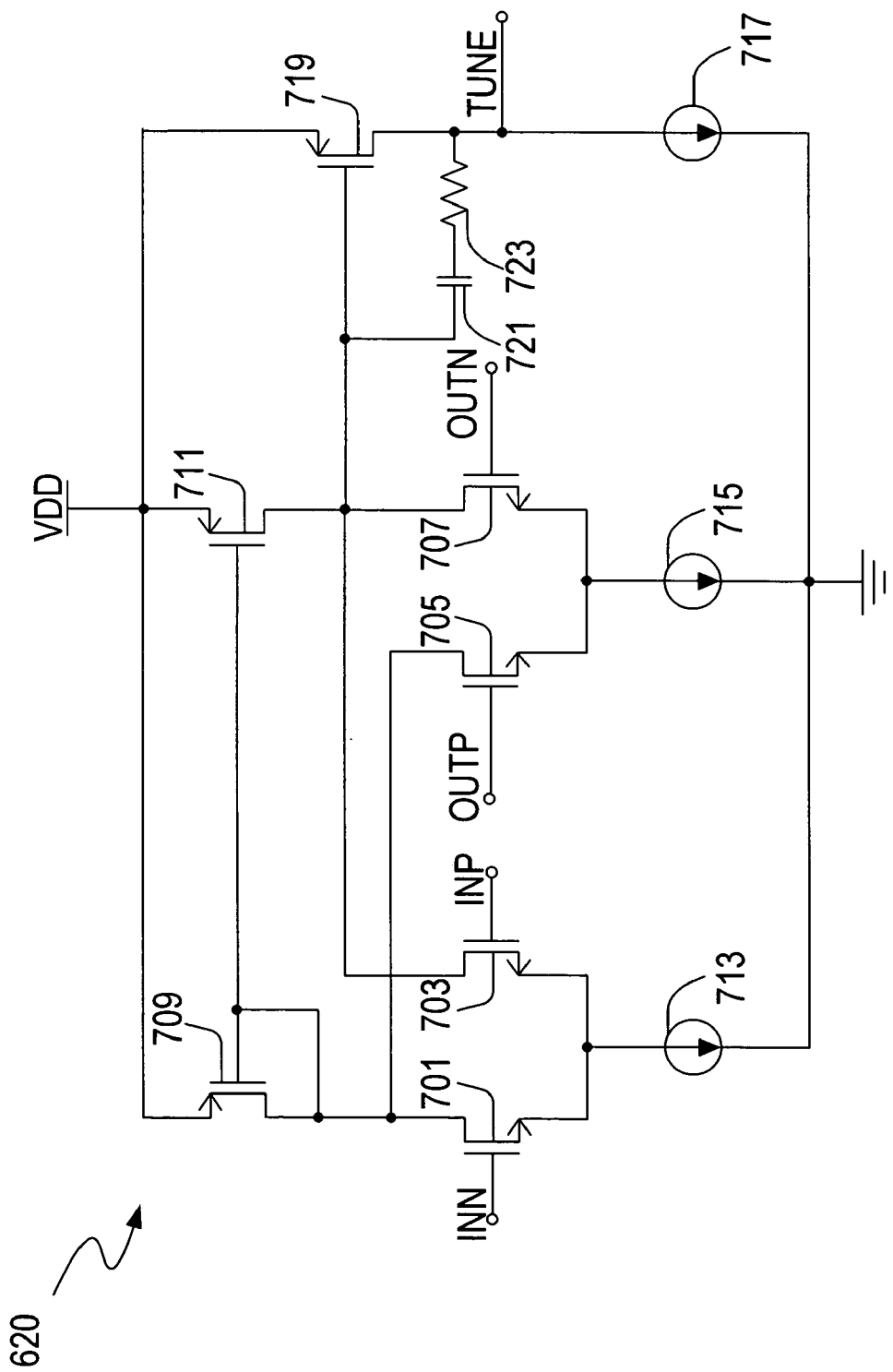
FIG. 11 is a schematic diagram of the differential input amplifier in FIG. 9.

FIG. 11 is a schematic diagram of the differential input amplifier 620 in FIG. 10. The differential input amplifier 620 includes a first differential input pair, a second differential input pair, an active load, a RC circuit, a transistor 719, and current sources 713, 715 and 717. Transistors 701 and 703 form the first differential input pair. Transistors 705 and 707 form the second differential input pair. Both differential input pairs share the same active load consisting of transistors 709 and 711 and form the first amplifying stage. The signals Vin+, Vin−, V_out+ and V_out− from the replica trans-conductor circuit in FIG. 10 is received respectively at terminals INP, INN, OUTP, and OUTN, and then amplified to an intermediate voltage signal by the first amplifying stage. The intermediate voltage signal is then passed to the transistor 719. The transistor 719 further amplifies the intermediate voltage signal to the tune signal TUNE and outputs the tune signal at the drain terminal. The RC circuit that is formed by a capacitor 721 and a resistor 723 is further connected between the gate and drain terminals of the transistor 719 for ensuring stability of the transconductance tracking loop.

Figure 12:
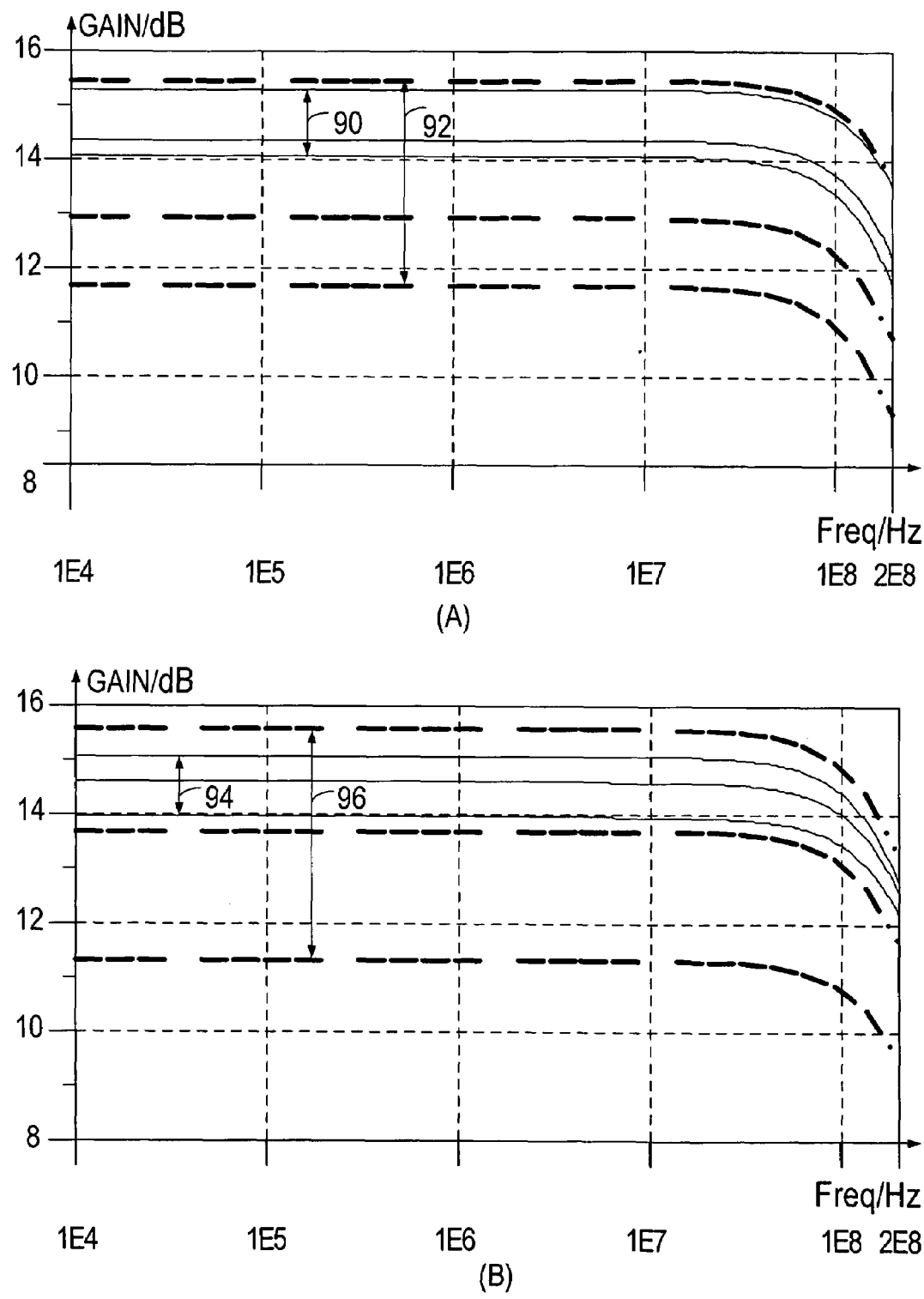
FIG. 12 is a Bode plot of the fixed gain amplifier in FIG. 9.

FIG. 12 is a Bode plot of the fixed gain amplifier 203B. The gain $A_G$ in dB is plotted against the frequency in Hz. When the temperature changes from −40° C. to 125° C., plot (A) indicates gain variation in response to the temperature variation. It can be observed that the gain of the fixed gain amplifier 203B has a variation 90, the gain of the conventional fixed gain amplifier has a variation 92, and the variation 90 is much less than the variation 92. When the process change incurs a ±20% resistance variation, plot (B) indications gain variation in response to the resistance variation. It can be observed that the gain of the fixed gain amplifier 203B has a variation 94, the gain of the conventional fixed gain amplifier has a variation 96, and the variation 94 is much less than the variation 96.

Figure 13:
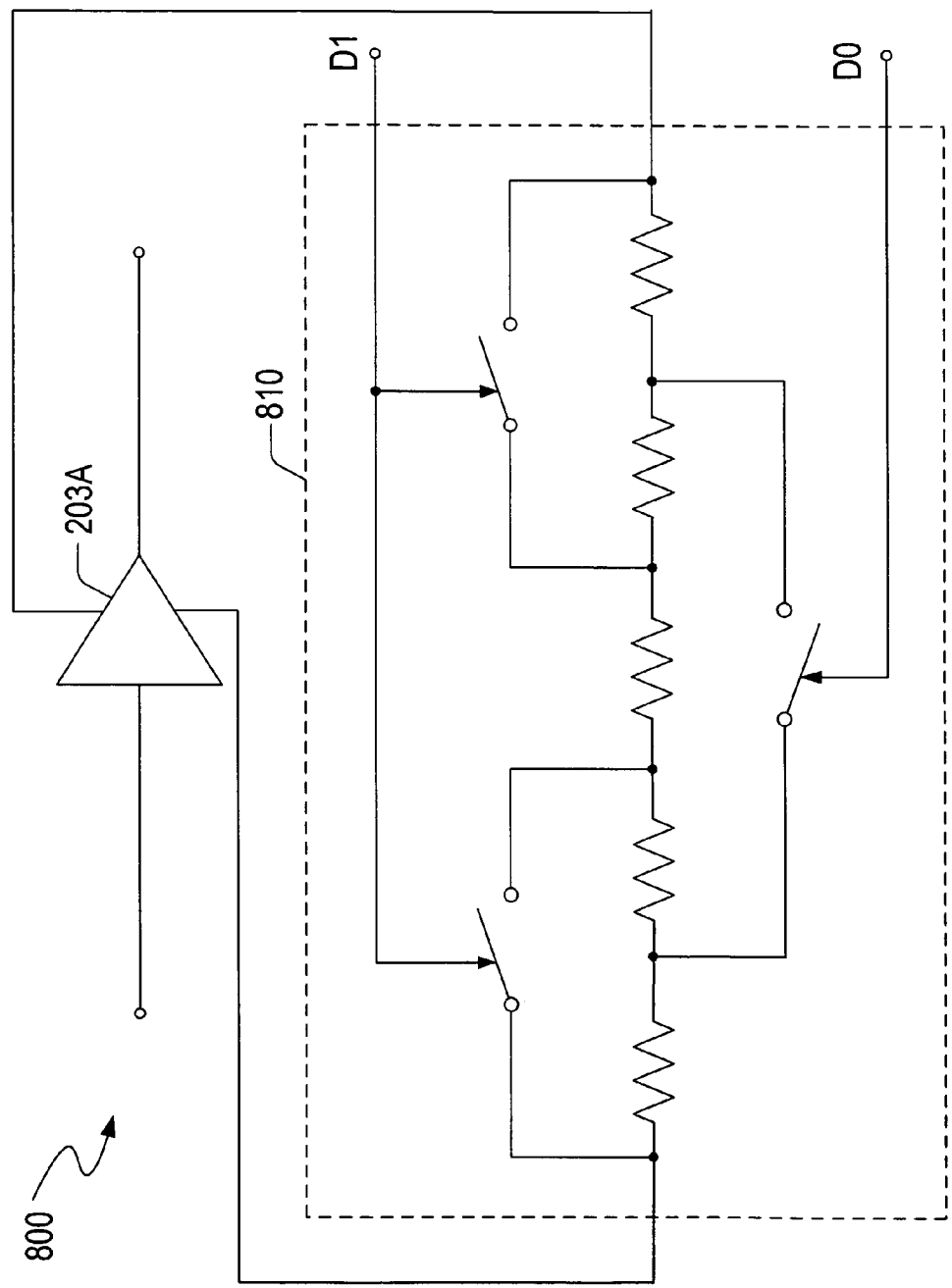
FIG. 13 is a programmable gain amplifier (PGA) according to one embodiment of the present invention.

The aforementioned fixed gain amplifier 203A or 203B can also be utilized to form a programmable gain amplifier (PGA). FIG. 13 illustrates a schematic diagram of an exemplary PGA 800. The PGA 800 includes the fixed gain amplifier 203A and a resistor network 810. The resistance of the resistor network 810 is programmable. The resistor network 810 can be realized by a plurality of resistors and switches as shown in FIG. 13. The switches are turned on or off by control bits received from control terminals D0 and D1. According to the on and off states of the switches, the resistance of the resistor network 810 is determined. In the PGA 800, the resistor network 810 replaces the resistors 423 and 423' in FIG. 7 to determine the overall gain of the fixed gain amplifier 203A. With the programmable resistor network 810, the gain of the amplifier 800 becomes programmable. In designs, the PGA 800 can further be cascaded to form a PGA with a plurality of stages to adapt to various applications.

In operation, the VGA circuit 300 can receive an input intermediate frequency signal and output a constant signal with an optimal level. The VGA circuit 300 includes an amplifier unit and an automatic gain control loop. The amplifier unit includes a variable gain amplifier 201 and a fixed gain amplifier 203. The fixed gain amplifier 203 can maintain the gain constant regardless of PVT variations. The automatic gain control loop can provide a control signal to the variable gain amplifier 201 and the control signal regulates the gain of the variable gain amplifier 201. Consequently, the constant signal with the optimal level is obtained.

The gain of the fixed gain amplifier 203 is determined by the ratio between the resistances of two resistors. The two resistors are of the same type and resistances of the two resistors match with each other, so that the gain of the fixed gain amplifier 203 is maintained constant when the PVT conditions vary. Furthermore, a PGA 800 can be formed by cascading multiple fixed gain amplifiers.

The automatic gain control loop includes the first peak detector 205-1, the second peak detector 205-2 and the comparator 207, wherein the second peak detector 205-2 is a replica of the first peak detector 205-1. The first peak detector 205-1 receives the output signal from the fixed gain amplifier 203 and the second peak detector 205-2 receives a reference signal Vref. When the peak of the output signal is equal to the peak of the reference signal Vref, the constant signal with the optimal level is obtained. Since the first and second peak detectors have identical response to PVT variation, the peak of the output signal is guaranteed to become equal to the peak of the reference signal Vref in various PVT conditions. In other words, the output signal is maintained constant regardless of PVT variations.

The terms and expressions which have been employed herein are used as terms of description and not of limitation, and there is no intention, in the use of such terms and expressions, of excluding any equivalents of the features shown and described (or portions thereof) and it is recognized that various modifications are possible within the scope of the claims. Other modifications, variations, and alternatives are also possible. Accordingly, the claims are intended to cover all such equivalents.

What is claimed is:

1. A variable gain amplifier circuit with automatic gain control comprising:
   an amplifier unit having a predetermined gain, the amplifier circuit being capable of receiving an input signal and generating an output signal, the output signal having a first peak; and
   an automatic gain control loop with a plurality of peak detectors connected to the amplifier unit, the automatic gain loop being capable of receiving the output signal and a reference signal with a second peak, the automatic gain loop with the plurality of peak detectors further being capable of detecting the first peak and the second peak, comparing the first peak with the second peak and generating a control signal, the control signal being used by the amplifier unit to regulate the predetermined gain, wherein the plurality of peak detectors further comprising:
   a first peak detector connected to the amplifier unit, the first peak detector being capable of detecting the first peak and providing a first peak signal indicative of the first peak;
   a second peak detector being capable of detecting the second peak and providing a second peak signal indicative of the second peak; and
   a comparator circuit connected to the first and second peak detectors and the amplifier unit, the comparator circuit being capable of comparing the first and second peak signals generating the control signal and providing the control signal to the amplifier unit.

2. The variable gain amplifier circuit of claim 1, wherein the amplifier unit further comprising a variable gain amplifier and a fixed gain amplifier.

3. The variable gain amplifier circuit of claim 2, wherein the fixed gain amplifier having a fixed gain, the fixed gain being determined by two resistors.

4. The variable gain amplifier circuit of claim 1, wherein the second peak detector being a replica of the first peak detector.

5. The variable gain amplifier circuit of claim 1, wherein the automatic gain control loop further comprising a filter for filtering the control signal.

6. A method for amplifying an input signal to a constant output signal, comprising the steps of:
   receiving the input signal;
   generating by an amplifier unit an output signal with a predetermined gain;
   generating a first peak signal indicative of a peak of the output signal;
   generating a second peak signal indicative of a peak of a reference signal;
   generating by a loop filter a control signal according to comparison between the first peak signal and the second peak signal; and
   regulating the predetermined gain under control of the control signal to ensure the output signal being constant.

7. The method of claim 6, wherein the peak of the output signal and the peak of the reference signal being detected by replica peak detectors.

8. The method of claim 6, wherein the output signal being constant when the peak of the output signal is equal to the peak of the reference signal.

9. The method of claim 6, further comprising the step of filtering the control signal before regulating the predetermined gain.

10. A peak detector for detecting a peak of a signal, comprising:
    a rectifier for receiving the signal and providing a current signal;
    a current mirror coupled to the rectifier, the current mirror being capable of mirroring the current signal and generating a mirrored current signal, the mirrored current signal having a DC level;
    a low pass filter coupled to the current mirror, the low pass filter being capable of receiving the mirrored current signal and providing an output voltage signal, the low pass filter including a resistor coupled in parallel to a capacitor, and the output voltage signal indicating the peak of the signal.

11. The peak detector of claim 10, further comprising a current source coupled to the current mirror for enhancing the DC level of the mirrored current signal.

12. The peak detector of claim 10, wherein the rectifier being a full-wave rectifier.

* * * * *